United States Patent [19]

Inoue et al.

[11] Patent Number: 5,180,627
[45] Date of Patent: Jan. 19, 1993

[54] HEAT RESISTANT ADHESIVE COMPOSITION

[75] Inventors: Hiroshi Inoue; Seiichirou Takabayashi; Tadao Muramatsu; Tsutomu Funagoshi; Tetsuji Hirano, all of Osaka, Japan

[73] Assignee: Ube Industries, Ltd., Yamaguchi, Japan

[21] Appl. No.: 801,686

[22] Filed: Dec. 2, 1991

[30] Foreign Application Priority Data

| Nov. 30, 1990 | [JP] | Japan | 2-330101 |
| Nov. 30, 1990 | [JP] | Japan | 2-330102 |
| Jul. 23, 1991 | [JP] | Japan | 3-273019 |
| Jul. 26, 1991 | [JP] | Japan | 3-274459 |

[51] Int. Cl.$^5$ .................. B32B 7/02; C08F 283/10; C08F 283/12
[52] U.S. Cl. .................. 428/214; 428/416; 428/448; 428/450; 428/473.5; 528/27; 528/40; 528/41; 528/33; 525/431; 525/487; 525/523
[58] Field of Search .......... 528/27, 40, 41, 33; 525/523, 487, 431, 476; 428/416, 448, 450, 473.5, 214

[56] References Cited

U.S. PATENT DOCUMENTS

| 4,511,701 | 4/1985 | Ryang | 525/533 |
| 4,794,148 | 12/1988 | Nakamura et al. | 525/530 |
| 4,808,676 | 2/1989 | Nishi et al. | 525/423 |
| 4,973,645 | 11/1990 | Lee | 528/26 |
| 5,006,614 | 4/1991 | Itoh et al. | 525/476 |
| 5,041,474 | 8/1991 | Kim et al. | 523/435 |
| 5,061,774 | 10/1991 | Park et al. | 528/26 |

FOREIGN PATENT DOCUMENTS 3130619 6/1988 Japan.

Primary Examiner—John C. Bleutge
Assistant Examiner—Margaret W. Glass
Attorney, Agent, or Firm—McAulay Fisher Nissen Goldberg & Kiel

[57] ABSTRACT

The disclosed heat resistant adhesive composition comprises a polyimidesiloxane obtained from a biphenyltetracarboxylic acid or its derivative and a diamine composition comprising a diaminopolysiloxane and an aromatic diamine, an epoxy compound having an epoxy group, and an epoxy compound-hardening agent. An adhesive film and a composite sheet utilizing the heat resistant resinous composition are also disclosed.

7 Claims, No Drawings

HEAT RESISTANT ADHESIVE COMPOSITION

BACKGROUND OF THE INVENTION

This invention relates to a heat resistant resinous adhesive composition. The invention further relates to an adhesive film and a composite film utilizing the adhesive composition.

Heretofore, flexible circuit-printable boards have been produced, for instance, by combining a metal film such as a copper foil and a heat resistant polymer film such as an aromatic polyimide film by an adhesive such as an epoxy resin or a urethane resin. Since these known flexible circuit-printable boards are not sufficiently satisfactory in their heat resistance, they sometimes suffer troubles such as swelling and peeling-off at the layer of an adhesive when they are placed under high temperature conditions, for instance, they are brought into contact with a melted solder. Therefore, a number of studies for improvement of heat resistance of the adhesives have been made. Similar problem occurs in a metal-foil laminated substrate for tape automated bonding (TAB).

For instance, an imide resin-type adhesive such as a precondensate of N,N'-(4,4'-diphenylethane)bismaleimide and diaminophenylmethane has been proposed. This adhesive, however, is not appropriately employed as an adhesive for flexible circuit-printable boards, because a cured product of the adhesive is poor in its mechanical strength.

Japanese Patent Provisional Publications No. 62(1987)-232475 and No. 62(1987)-235382 describe an adhesive film (i.e., a dry film) of a resinous composition comprising an aromatic polyimide prepared from benzophenonetetracarboxylic acid and an aromatic diamine and polybismaleimide. This film is used in such manner that the film is placed between a heat resistant film such as a polyimide film and a copper foil and they are heated under pressure to give a composite sheet. This adhesive film has a high softening point such as a softening point of not lower than 180° C. Therefore, the adhesion of a polyimide film and a copper foil should be done at a high temperature of approx. 260° to 280° C. and at a high pressure of approx. 30 to 60 kg/cm². Such conditions are very severe for conventionally employed heat-pressure rolls made of an organic resin. Accordingly, it is extremely difficult to laminate a polyimide film on a copper foil in a continuous procedure.

As coating compositions for coating electronic parts such as circuit-printable boards, a number of resin solutions (i.e., varnishes) comprising an aromatic polyimide and an epoxy resin have been proposed. However, these resin solutions are not practically employable as adhesives for combining a metal film such as a copper foil and a heat resistant film, particularly, an aromatic polyimide film, because these adhesives have drawbacks such that the adhesion procedure or curing procedure should be performed at extremely high temperatures, the aromatic polyimide is hardly miscible with the epoxy resin, the aromatic polyimide is hardly dissolved in a solvent used, and/or a cured adhesive layer is poor in its flexibility.

SUMMARY OF THE INVENTION

It is an object of the present invention to provide an improved heat resistant resinous adhesive composition, which is appropriately employable for combining a metal film and a heat resistant film.

It is another object of the invention to provide a heat resistant resinous adhesive composition having a relatively low softening point.

It is a further object of the invention to provide a heat resistant adhesive composition which is suitably employable for combining a metal foil and an aromatic polyimide film.

It is a still further object of the invention to provide an adhesive film which is appropriately employable for combining a metal fiil and a heat resistant film.

It is a still further object of the invention to provide a flexible composite sheet comprising a metal film and a heat resistant film which is combined by a heat resistant adhesive.

The present invention provides a heat resistant adhesive composition which comprises:

100 weight parts of a polyimidesiloxane obtained from a biphenyltetracarboxylic acid or its derivative and a diamine composition comprising a diaminopolysiloxane having the formula (I):

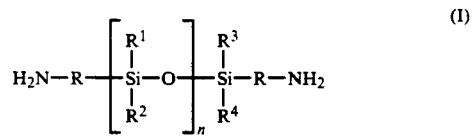

wherein R is a divalent hydrocarbon group, each of $R^1$, $R^2$, $R^3$ and $R^4$ independently is a lower alkyl group or phenyl group, and n is an integer of 3–60, and an aromatic diamine, said diaminopolysiloxane and aromatic diamine being used in a ratio of 2:8 to 8:2;

10–500 weight parts (preferably 10–100 weight parts, more preferably 20–80 weight parts) of an epoxy compound having an epoxy group; and an epoxy compound-hardening agent of 0.01–60 weight parts (particularly 0.03–50 weight parts) per 100 weight parts of the epoxy compound.

The invention further provides an adhesive film made of the above adhesive composition.

The invention further provides a composite sheet in which a metal film and a heat resistant film such as a polyimide film are combined by the above-mentioned adhesive composition to give a flexible multi-layered sheet.

DETAILED DESCRIPTION OF THE INVENTION

The polyimidesiloxane employed in the invention preferably is a high molecular weight polysiloxane obtained from an aromatic tetracarboxylic acid (or its derivative) and a diamine mixture through polymerization and imidization. The aromatic tetracarboxylic acid or its derivative preferably is 3,3',4,4'-biphenyltetracarboxylic acid (or its dianhydride or ester) or 2,3,3',4'-biphenyltetracarboxylic acid (or its dianhydride or ester). The latter 2,3,3',4'-biphenyltetracarboxylic acid (or its dianhydride or ester) is particularly preferred, because a polyimidesiloxane prepared from this biphenyltetracarboxylic acid or its derivative and a diamine mixture through polymerization and imidization is highly soluble in polar organic solvents and further shows high compatibility with an epoxy compound to be used in combination. Each of these biphenyltetracarboxylic acids and their derivatives can be used in combination with other aromatic tetracarboxylic acids or their derivatives. Preferably, the aromatic tetracarboxylic acid or its derivative of the starting material contains one of the above mentioned biphenyltetracarboxylic acids or their derivatives in an amount of not less than 60 molar %, specifically not less than 80 molar %. The diamine mixture comprises 20–80 molar % (preferably 20–70 molar %, more preferably 22–66 molar %) of a diaminopolysiloxane having the aforementioned formula (I) and 20–80 molar % (preferably 30–80 molar %, more preferably 34–78 molar %) of an aromatic diamine compound. The molar % is calculated based on the amount of the diamine mixture.

The polyimidesiloxane used in the invention preferably has a high molecular weight such that its logarithmic viscosity is in the range of 0.05 to 7, particularly 0.07 to 4, more particularly 0.1 to 3 (measurement conditions: 0.5 g/100 ml of N-methyl-2-pyrrolidone at 30° C.). The polyimidesiloxane of the invention is preferably soluble in one of polar organic solvents (particularly, amide-type solvents) at not less than 3 weight %, more preferably approx. 5 to 40 weight %.

The polyimidesiloxane preferably has an imidization ratio (determinied by infrared absorption spectrum) of not less than 90%, more preferably not less than 95%. Most preferably, the polyimidesiloxane shows an infrared absorption spectrum in which an absorption peak corresponding to an imide ring is observed and an absorption peak corresponding to an amide acid bonding disappears.

Further, the polyimidesiloxane preferably shows a modulus of elasticity of not higher than 250 kg/mm$^2$, particularly not higher than 200 kg/mm$^2$ and more particularly 0.5 to 150 kg/mm$^2$, in the form of a film. The polyimidesiloxane preferably has a thermal decomposition-starting temperature of not lower than 250° C., particularly not lower than 300° C., and a secondary transition temperature of not lower than −10° C., particularly in the range of approx. 30° to 250° C. Its softening temperature preferably is not lower than −10° C., more preferably is in the range of approx. 5° to 250° C.

The polyimidesiloxane can be prepared by polymerization-imidization reaction of the starting materials (the aforementioned aromatic tetracarboxylic acid or its derivative and the diamine mixture) at a high temperature such as a temperature of not lower than 140° C., in a polar organic solvent such as a phenolic solvent, an amide-type solvent, a sulfur atom-containing solvent, a glycol-type solvent, or an alkylurea-type solvent.

The polyimidesiloxane can be also prepared by polymerizing the aromatic tetracarboxylic acid or its derivative and the diamine mixture at a low temperature such as a temperature of 0°–80° C. in a polar organic solvent to give a polyamic acid having a logarithmic viscosity of not lower than 0.05 and then imidizing the polyamic acid in a known manner to give the desired polyimidesiloxane having good solubility in polar organic solvents.

The polyimidesiloxane can be also prepared by first producing an imidesiloxane oligomer from the diaminosiloxane and an excessive amount of the aromatic tetracarboxylic acid or its derivative (having an average polymerization degree of 1–10 and an acid or acid anhydride group as its terminal group; referred to as X-component or A-component) and an imide oligomer from the aromatic tetracarboxylic acid or its derivative and an excessive amount of the aromatic diamine (having an average polymerization degree of 1–10 and an amino group as its terminal group; referred to as Y-component or B-component) separately and then reacting the X-component and the Y-component under the condition that, in the reaction mixture, the molar amount of the acid component is almost equivalent to the molar amount of the diamine component to give the desired polyimidesiloxane in the form of a block polymer.

As described hereinbefore, the aromatic tetracarboxylic acid or its derivative contains a biphenyltetracarboxylic acid or its derivative as a main ingredient. Examples of other aromatic tetracarboxylic acids and their derivatives employable in combination with the biphenyltetracarboxylic acid or its derivative include 3,3',4,4'-benzophenonetetracarboxylic acid, 3,3',4,4'-diphenylethertetracarboxylic acid, bis (3,4-dicarboxyphenyl) acid, bis (3,4-dicarboxyphenyl)methane, 2,2-bis(3,4-dicarboxyphenyl)propane, pyromellitic acid and their dianhydrides and esters.

If the aromatic tetracarboxylic acid or its derivative contains no or only a small amount of a biphenyltetracarboxylic acid or its derivative, the resulting polyimidesiloxane likely shows unsatisfactorily low solubility in polar organic solvents and/or shows poor compatibility with an epoxy resin.

In the formula (I) for the polysiloxane which is used for the preparation of the polyimidesiloxane, R is a divalent hydrocarbon group such as an alkylene group comprising 2–6 (particularly 3–5) methylene groups or a phenylene group. Each of $R^1$, $R^2$, $R^3$, and $R^4$ is independently a lower alkyl group having 1–5 carbon atoms (e.g., methyl, ethyl or propyl) or a phenyl group. "n" preferably ranges 5 to 20, more preferably 5 to 15.

The aromatic diamine also used for the preparation of the polyimidesiloxane preferably has two or more (more preferably, 2 to 5) aromatic rings such as benzene rings and their examples are as follows:

(a) diphenylalkane-type diamine compounds such as biphenyl-type diamine compounds, diphenylether-type diamine compounds, benzophenone-type diamine compounds, diphenylsulfone-type diamine compounds, diphenylmethane-type diamine compounds, and 2,2-bis(phenyl)propane; 2,2-bis(phenyl)hexafluoropropane-type diamine compounds; and diphenylenesulfone-type diamine compounds;

(b) di(phenoxy)benzene-type diamine compounds; and di(phenyl)benzene diamine compounds; and (c) di(phenoxyphenyl)hexafluoropropane-type diamine compounds, di(phenoxyphenyl)propane-type diamine compounds, and di(phenoxyphenyl)sulfonediamine-type compounds.

Any aromatic diamine can be used singly or in combination with one or more aromatic diamines.

Preferred are diphenylether-type diamine compounds such as 1,4-diaminodiphenylether and 1,3-diaminodiphenylether; di(phenoxy)benzene-type diamine compounds such as 1,3-di(4-aminophenoxy)benzene and 1,4-di(4-aminophenoxy)-benzene; di(phenoxyphenyl)propane-type diamine compounds such as 2,2-di(4-(4-aminophenoxy)phenyl)propane and 2,2-di(4-(3-aminophenoxy)phenyl)propane; and di(phenoxyphenyl)sulfone-type diamine compounds such as bis(4-(4-aminophenoxy)phenyl)sulfone and bis(4-(3-aminophenoxy)phenyl)sulfone. If the above preferred aromatic diamine is used in combination with other aromatic diamines, it is preferred that the preferred aromatic diamine occupies not less than 90 molar % of the total amount of the aromatic diamine composition.

Examples of the polar organic solvents employed for the preparation of the polyimidesiloxane include amide-type solvents such as N,N-dimethylacetamide, N,N-diethylacetamide, N,N-dimethylformamide, and N-methyl-2-pyrrolidone; sulfur atom-containing solvents such as dimethylsulfoxide, diethylsulfoxide, dimethylsulfone, diethylsulfone and hexamethylsulfonamide; phenolic solvents such as cresol, phenol, and xylenol; oxygen atom-containing solvents such as acetone, methanol, ethanol, ethyleneglycol, dioxane and tetrahydrofuran; and other polar solvents such as pyridine and tetramethylurea. If desired, aromatic hydrocarbon-type solvents such as benzene, toluene and xylene or other solvents such as a solvent naphtha and benzonitrile can be used in combination with the above-mentioned polar organic solvent.

The epoxy compound employable for the preparation of the heat resistant adhesive composition of the invention has at least one epoxy group in its molecular structure. Examples of the epoxy compounds include bisphenol A type epoxy resins, bisphenol F type epoxy resins, phenol-novolak type epoxy resins, glycidyl ether type epoxy resins, glycidyl ester type epoxy resins, and glycidyl amine type epoxy resins. These epoxy resins can be used singly or in combination. The epoxy resin employed in the invention preferably has a melting point of not higher than 90° C., particularly in the range of 0° to 80° C., and most preferably is in a liquid form at room temperature such as temperatures of not higher than 30° C.

The hardening agent for the epoxy compound (i.e., epoxy hardener) is also included in the adhesive composition of the invention in an amount of 0.01 to 60 weight parts, particularly 0.03 to 50 weight parts, based on 100 weight parts of the epoxy resin. Examples of the epoxy hardeners include imidazoles, tert-amines, phenols, triphenylphosphines, dicyandiamides, hydrazines, aromatic diamines, and organic peroxides.

The heat resistant adhesive composition of the invention may further contain a bismaleimide resin. The bismaleimide resin is preferably contained in the adhesive composition in an amount of 5-500 weight parts, particularly 8-350 weight parts, more particularly 8-55 weight parts, and most particularly 8-30 weight parts, per 100 weight parts of the polyimidesiloxane. The bismaleimide can be a condensation product of maleic anhydride and a diamine compound which has unsaturated bond (double bond originating from the unsaturated bond of maleic anhydride) at each terminal. A preferred bismaleimide resin employable in the invention is a reaction product of 2 moles of maleic anhydride and 1 mole of an aromatic diamine. Examples of the aromatic diamine emplyable for this purpose include diaminobenzene, 4,4'-diamino-3,3'-dimethylbiphenyl, 1,4-diaminodiphenyl ether, 1,4-diaminodiphenylmethane, 2,2-bis(4-aminophenyl)propane, 1,4-diaminodiphenylsulfone, 1,3-bis(4-aminophenoxy)benzene, 1,4-bis(3-aminophenoxy)benzene, and bis(4-(3-aminophenoxy)phenyl)sulfone.

Also employable is a bismaleimide compound having the formula (II):

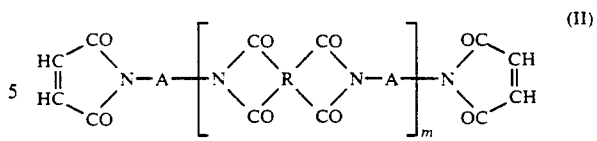

wherein A is a divalent group originating from a diamine compound; R is a tetravalent group originating from a tetracarboxylic acid or its derivative; and "m" is an integer of 1 to 10, particularly 1 to 5.

The bismaleimide compound of the formula (II) can be prepared by first reacting a tetracarboxylic acid (e.g., biphenyltetracarboxylic acid) or its derivative and an excessive amount of a diamine to give an imide oligomer having amino group at each terminal and then reacting the imide oligomer with maleic anhydride.

Also employable are commercially available bismaleimide resins such as "Bismaleimide" of Mitui Toatsu Chemical Co., Ltd., "Bismaleimide (ATU-BMI resin) of Ajinomoto Co., Ltd., "Kelimide(NE20200)" of Nippon Polyimide Co., Ltd., and "Compimide 353" of Technochemie Co., Ltd.

If the bismaleimide resin is incorporated into the adhesive composition of the invention, the epoxy compound is preferably incorporated into the composition in an amount of 55-250 weight parts (particularly, 60-150 weight parts) per 100 weight parts of the polyimidesiloxane.

The heat resistant adhesive composition of the invention can contain a small amount of other resins and additives. For instance, a thermosetting resin such as phenol resin may be incorporated.

The heat resistant adhesive composition of the invention preferably has a softening point (i.e., a temperature at which the composition begins to soften on a hot plate) of not higher than 150° C., more preferably not higher than 120° C., and most preferably not higher than 100° C., before it is cured. The adhesive composition of the invention preferably is heat-curable at 130°–400° C., and more preferably is heat-curable at 140°–350° C.

The heat resistant adhesive composition of the invention can be prepared in the form of a solution in which the adhesive composition is homogeneously dissolved. The solvent employable for the preparation of the adhesive solution preferably is an oxygen atom-containing polar organic solvent such as dioxane or tetrahydrofuran. Other polar organic solvents employable for the preparation of the polyimidesiloxane can be also employed for this purpose. In the solution, the adhesive composition can be present at a concentration of 3-50 weight %, particularly 5-40 weight %, in an appropriate polar organic solvent. In the adhesive solution, a small amount (not more than 10 weight %) of other adhesive agents can be present in addition to the adhesive composition of the invention. The adhesive solution of the invention preferably has a solution viscosity of 0.1-10,000 poise (at 30° C.), more preferably 0.2-5,000 poise, and most preferably 1-1,000 poise.

The adhesive solution of the invention can contain an inorganic filler in an amount of 1-50 weight %, preferably 5-40 weight %, based on the amount of the adhesive composition of the invention, in which the inorganic filler is uniformly dispersed.

The adhesive composition of the invention can be produced in the form of a film having a thickness of approx. 1-200 μm (micrometer), particularly 5-150 μm. For instance, the above-mentioned adhesive solution is cast on a surface of a metal foil, a heat resistant polymer film such as a polyimide film, or a thermoplastic polymer film such as a polyester film or a polyethylene film and the cast layer is dried at 60°-140° C. (particularly 80°-130° C.) for 20 sec. to 100 min. (particularly, 30-60 min.) to give a uncured adhesive dry film containing almost no solvent (at the most, 1 weight %, preferably at the most 0.5 weight %).

The uncured adhesive dry film of the invention has favorable flexibility. Therefore, it can be placed around a paper pipe. Further, it can be easily punched to give a perforated film. Furthermore, a composite sheet comprising the heat resistant or thermoplastic polymer film and the uncured adhesive dry film of the invention can be placed on a receiving metal foil or a receiving other heat resistant polymer film under the condition that the adhesive film faces the receiving material film and then thus obtained composite can be passed between a pair of rolls (i.e., laminating rolls) heated to approx. 20°-140° C., preferably to 30°-130° C., whereby the adhesive film is transferred onto the receiving film.

The heat resistant adhesive composition and film of the invention are advantageously employed for preparing composite materials such as a circuit printable board of a copper foil and a polymer film. For instance, the adhesive composition or film is interposed between a heat resistant film such as an aromatic polyimide film and a metal foil such as a copper foil, and thus formed composite material is first heated to 80°-190° C., particularly to 100°-180° C. The heated composite is further heated at an elevated temperature in the range of 80°-350° C. for 30 min. to 40 hrs., particularly 1 to 30 hrs., so as to cure (or harden) the heat resistant adhesive layer to give the desired strongly combined composite material. These procedures can be easily performed in a continuous process.

The heat resistant adhesive composition and film of the invention is favorably employable for combining a metal film such as copper foil and a heat resistant film such as an aromatic polyimide film, a polyamide film, a polyether film, or a polyethersulfone film to give a strongly combined composite material.

Examples of the present invention and comparison examples are given below.

In the following examples, the logarithmic viscosity ($\eta_{inh}$) was determined as follows: a solution of the aromatic polyimide or imide oligomer in N-methyl-2-pyrrolidone (0.5 g/100 ml) was prepared, and its solution viscosity and the viscosity of the solvent alone were measured at 30° C. The measured values were incorporated into the following equation to give the logarithmic viscosity:

$$\eta_{inh} = \frac{\ln (\text{Solution Viscosity/Solvent Viscosity})}{\text{Concentration of Solution}}$$

The softening temperature of polyimidesiloxane film was determined from a value of tanδ (high temperature side) of viscoelasticity peak measured in viscoelasticity test.

The adhesive strength was measured at a peel rate of 50 mm/min. in a T-type peel-test machine (Tensile Machine manufactured by Intesco Corp.).

The curvature radius which means a curling tendency of the circuit-printed board prepared by etching a copper foil out of a circuit-printable board having a heat-resistant adhesive layer was determined by the equation (curvature radius (mm)=$L^2/8h$; L means a length of sample, and h means a curled height) defined JIS-C-5012.

REFERENCE EXAMPLE 1

Preparation of Imidesiloxane Oligomer $X^1$

In a 500 ml-volume glass flask, 88.27 g (0.3 mol) of 2,3,3',4'-biphenyltetracarboxylic dianhydride (referred to as a-BPDA), 176 g (0.2 mol) of a diaminosiloxane of the formula (I) (R: —CH$_2$CH$_2$CH$_2$—, each of $R^1$-$R^4$: methyl, n: 9: referred to as DASi) and 1957.08 g of N-methyl-2-pyrrolidone (referred to as NMP) were stirred at 50° C. for 2 hrs. in a nitrogen stream to give an amic acid oligomer. The reaction solution was then heated to approx. 200° C. and stirred at the temperature for 3 hrs. to produce an imidesiloxane oligomer having an anhydride moiety at its terminal position ($X^1$-component, average polymerization degree: 2).

REFERENCE EXAMPLE 2

Preparation of Imidesiloxane Oligomer $X^5$

In a 500 ml-volume glass flask, 205.95 g (0.7 mol) of 2,3,3',4'-biphenyltetracarboxylic dianhydride (a-BPDA), 528 g (0.6 mol) of a diaminosiloxane of the formula (I) (R: —CH$_2$CH$_2$CH$_2$—, each of $R^1$-$R^4$: methyl, n: 9, DASi) and 1057.08 g of N-methyl-2-pyrrolidone (NMP) were stirred at 50° C. for 2 hrs. in a nitrogen stream to give an amic acid oligomer. The reaction solution was then heated to approx. 200° C. and stirred at the temperature for 3 hrs. to produce an imidesiloxane oligomer having an anhydride moiety at its terminal position ($X^5$-component, average polymerization degree: 6).

REFERENCE EXAMPLE 3

Preparation of Imide Oligomer $Y^1$

In a 500 ml-volume glass flask, 58.84 g (0.2 mol) of 2,3,3',4'-biphenyltetracarboxylic dianhydride (a-BPDA), 123.16 g (0.3 mol) of 2,2-bis(4-(4-aminophenoxy)phenyl)propane (BAPP) and 1855.58 g of N-methyl-2-pyrrolidone (NMP) were stirred at 50° C. for 2 hrs. in a nitrogen stream to give an amic acid oligomer. The reaction solution was then heated to approx. 200° C. and stirred at the temperature for 3 hrs. to produce an imide oligomer having an amino moiety at its terminal position ($Y^1$-component, average polymerization degree: 2).

REFERENCE EXAMPLE 4

Preparation of Imide Oligomer $Y^5$

In a 500 ml-volume glass flask, 176.53 g (0.6 mol) of 2,3,3',4'-biphenyltetracarboxylic dianhydride (a-BPDA), 287.36 (0.7 mol) of 2,2-bis(4-(4-aminophenoxy)-phenyl)propane (BAPP) and 1855.58 g of N-methyl-2-pyrrolidone (NMP) were stirred at 50° C. for 2 hrs. in a nitrogen stream to give an amic acid oligomer. The reaction solution was then heated to approx. 200° C. and stirred at the temperature for 3 hrs. to produce an imide oligomer having an amino moiety at its terminal position ($Y^5$-component, average polymerization degree: 6).

REFERENCE EXAMPLE 5

Preparation of Polyimidesiloxane

In a 500 ml-volume glass flask, 25.71 g of $X^1$-component (prepared in Reference Example 1), 44.23 g of $Y^5$-component (prepared in Reference Example 4), and 299.76 g of NMP were stirred at 50° C. for 1 hr. in a nitrogen stream to give a polyamic acid block polymer. The reaction solution was then heated to approx. 200° C. and stirred at the temperature for 3 hrs. to produce an polyimidesiloxane (block polymer; $X^1-Y^5$).

The produced polyimide siloxane had an imidization ratio of not lower than 95% and showed a logarithmic viscosity of 0.49.

REFERENCE EXAMPLES 6 TO 8

Preparation of Polyimidesiloxanes

The procedures of Reference Example 5 were repeated except that the oligomers produced in Reference Examples 1–4 and N-methyl-2-pyrrolidone (NMP) were used in the amounts set forth in Table 1, to give polyimidesiloxanes.

The logarithmic viscosity of the resultant polyimidesiloxane and the elasticy modulus and softening temperature of a film made of the polyimidesiloxane are set forth in Table 1.

and finally to 260° C. for 10 hrs., to completely cure the adhesive layer.

The produced composite material was measured in its adhesive strength. The result is set forth in Table 2.

EXAMPLES 2 TO 6 AND COMPARISON EXAMPLES 1 TO 2

Preparation of Adhesive Composition Solution

The procedures of Example 1 were repeated except that the polyimidesiloxane and the epoxy compound were replaced with those set forth in Table 2, to give an adhesive composition solution having a viscosity set forth in Table 2.

Production of Composite Sheet using Adhesive Composition Solution

The procedures of Example 1 were repeated except for using the adhesive composition solution set forth in Table 2. The produced composite material was measured in its adhesive strength. The results are set forth in Table 2.

TABLE 1

| Ref. Ex. | Imidesiloxane Oligomer a-BPDA/DASi (molar ratio) | Imide Oligomer a-BPDA/BAPP (molar ratio) | NMP (g) | Block Polymer | $\eta_{inh}$ 30° C. | Film (50 um) Elasticity Modulus Softening Temp. |
|---|---|---|---|---|---|---|
| 5 | (0.3/0.2) $X^1$: 25.71 g | (0.6/0.7) $Y^5$: 44.23 g | 279.76 | $X^1-Y^5$ | 0.49 | 120 kg/mm$^2$ 230° C. |
| 6 | (0.3/0.2) $X^1$: 23.81 g | (0.2/0.3) $Y^1$: 16.19 g | 160.00 | $X^1-Y^1$ | 0.48 | 62 kg/mm$^2$ 185° C. |
| 7 | (0.7/0.6) $X^5$: 24.68 g | (0.6/0.7) $Y^5$: 15.32 g | 160.00 | $X^5-Y^5$ | 0.55 | 25 kg/mm$^2$ 110° C. |
| 8 | (0.7/0.6) $X^5$: 32.12 g | (0.2/0.3) $Y^1$: 7.88 g | 160.00 | $X^5-Y^1$ | 0.40 | 1 kg/mm$^2$ 12° C. |

EXAMPLE 1

Preparation of Adhesive Composition Solution

In a 500 ml-volume glass flask, 60 g of the polyimidesiloxane (block polymer $X^1-Y^5$, prepared in Reference Example 5), 40 g of an epoxy resin (Epikote 152, produced by Yuka Shell Epoxy Co., Ltd.), 0.1 g of 2-phenylimidazole (hardener) and 200 g of dioxane were stirred at room temperature (25° C.) for approx. 2 hrs., to give a homogeneous adhesive composition solution having a viscosity at 25° C. of 6 poise. This solution kept its homogeneous state, even after standing it to allow at room temperature for 1 week.

Production of Composite Sheet Using Adhesive Composition Solution

The above-obtained adhesive composition solution was cast on a polyimide film (UPILEX S-type, available from Ube Industries, Ltd.: thickness: 75 μm) of 175 μm thick using a doctor blade. The cast layer was dried at 60° C. for 10 min., at 100° C. for 10 min., and finally at 120° C. for 10 min. to give a uncured dry adhesive layer of approx. 25 μm thick (softening temperature: 95° C.).

The polyimide film having the uncured dry adhesive layer was placed on a copper foil (thickness: 35 μm) and passed between a pair of laminating rolls heated to 160° C. under pressure to firmly fix the polyimide film onto the copper foil. The fixed film and foil were together heated in a nitrogen stream to 180° C. for 2 hrs., to 200° C. for 2 hrs., to 220° C. for 1 hrs., to 240° C. for 1 hr., Table 2.

TABLE 2

| Ex. | Polyimide-siloxane Block (Ref.) Siloxane Unit Amount | Epoxy Compound Name used | Solution Viscosity (poise) | Adhesive Sof. Temp. (°C.) | Laminated Composite Adhesive Strength 25° C./ 180° C. |
|---|---|---|---|---|---|
| 1 | $X^1-Y^5$ (No. 5) 22.2 mol % 60 g | Epikote 152 40 g | 6 | 95 | 1.7/1.0 (kg/cm) |
| 2 | $X^1-Y^1$ (No. 6) 40.0 mol % 60 g | Epikote 152 40 g | 5 | 90 | 1.0/0.6 (kg/cm) |
| 3 | $X^5-Y^5$ (No. 7) 46.2 mol % 60 g | Epikote 152 40 g | 5 | 80 | 1.1/0.5 (kg/cm) |
| 4 | $X^1-Y^5$ (No. 5) 22.2 mol % 20 g | Epikote 152 80 g | 2 | 55 | 1.6/0.5 (kg/cm) |
| 5 | $X^1-Y^1$ (No. 6) 40.0 mol % 50 g | Epikote 871 50 g | 5 | 80 | 0.9/0.7 (kg/cm) |
| 6 | $X^5-Y^1$ (No. 8) 66.7 mol % 50 g | Epikote 871 50 g | 4 | 60 | 1.0/0.5 (kg/cm) |
| 1 Comp. | $X^5-Y^5$ (No. 7) 46.2 mol % 10 g | Epikote 152 90 g | 1 | <25 | 0.6/0.1 (kg/cm) |
| 2 Comp. | $X^1-Y^5$ (No. 5) 22.2 mol % 95 g | Epikote 152 5 g | 15 | 180 | —/— (kg/cm) |

Remark:

Siloxane Unit (content of siloxane unit in polyimidesiloxane) = 100×(Molar amount of diaminosiloxane/Molar amount of total diamines)

EXAMPLE 7

Preparation of Adhesive Composition Solution

In a 500 ml-volume glass flask, 70 g of the polyimidesiloxane (block polymer $X^1-Y^5$, prepared in Reference Example 5), 30 g of an epoxy resin (Epikote 828 and Epikote 871, produced by Yuka Shell Epoxy Co., Ltd.), 0.1 g of 2-phenylimidazole (hardener) and 200 g of dioxane were stirred at room temperature (25° C.) for approx. 2 hrs., to give a homogeneous adhesive composition solution having a viscosity at 25° C. of 25 poise. This solution kept its homogeneous state, even after standing it to allow at room temperature for 1 week.

Production of Composite Sheet using Adhesive Composition Solution

The above-obtained adhesive composition solution was cast on a polyimide film (UPILEX S-type, available from Ube Industries, Ltd.: thickness: 75 μm) to give a cast layer of 175 μm thick using a doctor blade.

The cast layer was dried at 60° C. for 10 min., at 100° C. for 10 min., and finally at 120° C. for 10 min. to give a uncured dry adhesive layer of approx. 25 μm thick (softening temperature: 95° C.).

The polyimide film having the uncured dry adhesive layer was placed on a copper foil (thickness: 35 μm) and passed between a pair of laminating rolls heated to 130° C. under pressure to firmly fix the polyimide film onto the copper foil. The fixed film and foil were together heated in a nitrogen stream to 80° C. for 2 hrs., to 100° C. for 2 hrs., to 120° C. for 1 hr., to 140° C. for 1 hr., and finally to 160° C. for 10 hrs., to completely cure the adhesive layer.

The produced composite material was measured in its adhesive strength. The result is set forth in Table 2.

EXAMPLES 8 TO 12 AND COMPARISON EXAMPLES 3 TO 4

Preparation of Adhesive Composition Solution

The procedures of Example 7 were repeated except that the polyimidesiloxane and the epoxy compound were replaced with those set forth in Table 3, to give an adhesive composition solution having a viscosity set forth in Table 3. Further, the hardener was changed to 25 g of diaminodiphenylmethane (Example 9), 26 g of diaminodiphenylsulfone (Example 10), 20 g of phenol-novolak (Example 11) and 0.1 g of 2-phenylimidazole (Example 12).

Production of Composite Sheet using Adhesive Composition Solution

The procedures of Example 7 were repeated except for using the adhesive composition solution set forth in Table 3. The produced composite material was measured in its adhesive strength. The results are set forth in Table 3.

TABLE 3

| Ex. | Polyimide-siloxane Block (Ref.) Siloxane Unit Amount | Epoxy Compound Name used | Solution Viscosity (poise) | Laminated Composite Adhesive Strength 25° C./180° C. | Etched Film Thick- Curv.- Radius |
|---|---|---|---|---|---|
| 7 | $X^1-Y^5$ (No. 5) 22.2 mol % 70 g | Epikote 828 Epikote 871 30 g | 25 | 1.85/0.70 (kg/cm) | 20 μm 100 mm |
| 8 | $X^1-Y^1$ (No. 6) 40.0 mol % 60 g | Epikote 152 Epikote 871 40 g | 20 | 1.75/0.65 (kg/cm) | 20 μm 150 mm |
| 9 | $X^5-Y^5$ (No. 7) 46.2 mol % 50 g | Epikote 152 Tetrade X 50 g | 13 | 1.45/0.55 (kg/cm) | 21 μm 240 mm |
| 10 | $X^1-Y^5$ (No. 5) 22.2 mol % 60 g | Epikote 152 Tetrade X 40 g | 20 | 1.80/0.60 (kg/cm) | 20 μm 110 mm |
| 11 | $X^1-Y^1$ (No. 6) 40.0 mol % 55 g | Epikote 152 IPU 22G 45 g | 15 | 1.70/0.55 (kg/cm) | 20 μm 130 mm |
| 12 | $X^5-Y^1$ (No. 8) 66.7 mol % 50 g | Epikote 151 Tetrade X 50 g | 7 | 1.20/0.55 (kg/cm) | 18 μm >500 mm |
| 3 Comp. | $X^5-Y^5$ (No. 7) 46.2 mol % 95 g | Epikote 152 5 g | 35 | 0.60/0.35 (kg/cm) | 25 μm >500 mm |
| 4 Comp. | $X^1-Y^5$ (No. 5) 22.2 mol % 20 g | Epikote 152 Tetrade X 80 g | 6 | 1.85/0.35 (kg/cm) | 25 μm 25 mm |

Remarks:
"Tetrade": epoxy resin available from Mitsubishi Gas Chemical Co., Ltd.
"IPU": epoxy resin available from Okamura Seiyu Co., Ltd.

REFERENCE EXAMPLE 9

Preparation of Imidesiloxane Oligomer A-1

In a 500 ml-volume glass flask, 0.054 mol of 2,3,3',4'-biphenyltetracarboxylic dianhydride (a-BPDA), 0.27 mol of ω,ω'-bis(3-aminopropyl)polydimethylsiloxane (X-22-161AS, produced by Shin-etsu Silicone Co., Ltd., n: 9, referred to X-22) and 160 g of N-methyl-2-pyrrolidone (NMP) were stirred at 50° C. for 2 hrs. in a nitrogen stream to give an amic acid oligomer. The reaction solution was then heated to approx. 200° C. and stirred at the temperature for 3 hrs. to produce an imidesiloxane oligomer having an anhydride moiety at its terminal position (A-1 component, average polymerization degree: 1).

REFERENCE EXAMPLES 10 AND 11

Preparation of Imidesiloxane Oligomers A-2 & A-3

The procedures of Reference Example 9 were repeated except that the amounts of a-BPDA, diaminopolysiloxane (X-22) and NMP were changed as set forth in Table 4, to produce imidesiloxane oligomers having an anhydride moiety at their terminal positions (A-2, average polymerization degree: 2, and A-3, average polymerization degree 6).

REFERENCE EXAMPLE 12

Preparation of Imide Oligomer B-1

In a 500 ml-volume glass flask, 0.035 mol of 2,3,3',4'-biphenyltetracarboxylic dianhydride (aBPDA), 0.070 mol of 2,2-bis(4-(4-aminophenoxy)phenyl)propane (BAPP) and 155 g of N-methyl-2-pyrrolidone (NMP) were stirred at 50° C. for 2 hrs. in a nitrogen stream to give an amic acid oligomer. The reaction solution was then heated to approx. 200° C. and stirred at the temperature for 3 hrs. to produce an imide oligomer having an amino moiety at its terminal position (B-1 component, average polymerization degree: 1).

REFERENCE EXAMPLES 13 TO 15

Preparation of Imide Oligomers B-2, B-3 & B-4

The procedures of Reference Example 12 were repeated except that the amounts of a-BPDA, BAPP and NMP were changed as set forth in Table 4, to produce imide oligomers having an amino moiety at their terminal positions (B-2 component, average polymerization degree: 2, B-3 component, average polymerization degree: 5, and B-4 component, average polymerization degree: 10).

TABLE 4

| Ref. Ex. Origomer | Acid comp. (a-BPDA) (mol) | Diamine comp. (X-22) (mol) | Diamine comp. (BAPP) (mol) | Solvent (NMP) (g) |
|---|---|---|---|---|
| 9: A-1 | 0.054 | 0.027 | — | 160 |
| 10: A-2 | 0.045 | 0.030 | — | 160 |
| 11: A-3 | 0.042 | 0.036 | — | 175 |
| 12: B-1 | 0.035 | — | 0.070 | 155 |
| 13: B-2 | 0.044 | — | 0.066 | 160 |
| 14: B-3 | 0.054 | — | 0.063 | 165 |
| 15: B-4 | 0.055 | — | 0.060 | 165 |

REFERENCE EXAMPLE 16

Preparation of Polyimidesiloxane

In a 500 ml-volume glass flask, 14.14 g (0.0055 mol) of the imidesiloxane oligomer (A-2 prepared in Reference Example 10) in NMP (concentration: 20 wt.%), and 23.33 g (0.0055 mol) of the imide oligomer (B-3 prepared in Reference Example 14) in NMP (concentration: 20 wt.%) were stirred at 50° C. for 1 hr. in a nitrogen stream to give a polyamic acid block polymer. The reaction solution was then heated to approx. 200° C. and stirred at the temperature for 3 hrs. to produce an polyimidesiloxane (block polymer; A-2–B-3).

The produced polyimide siloxane had an imidization ratio of not lower than 95% and showed a logarithmic viscosity of 0.49.

REFERENCE EXAMPLES 17 TO 20

Preparation of Polyimidesiloxanes

The procedures of Reference Example 16 were repeated except that the oligomers produced in Reference Examples 9–15 were used in the amounts set forth in Table 5, to give polyimidesiloxanes.

The logarithmic viscosity of the resultant polyimidesiloxane and the elasticy modulus and softening temperature of a film made of the polyimidesiloxane are set forth in Table 5.

REFERENCE EXAMPLE 21

Preparation of Polyimidesiloxane

In a 500 ml-volume glass flask, 0.054 mol of 2,3,3',4'-biphenyltetracarboxylic dianhydride (a-BPDA), 0.012 mol of the diaminopolysiloxane (X-22-161AS), 0.042 mol of 2,2-bis(4-(4-aminophenoxy)phenyl)propane (BAPP) and 175 g of N-methyl-2-pyrrolidone (NMP) were stirred at 50° C. for 2 hrs. in a nitrogen stream to give an amic acid oligomer. The reaction solution was then heated to approx. 200° C. and stirred at the temperature for 3 hrs. to produce a polyimidesiloxane (random polymer, logarithmic viscosity: 0.59, content of siloxane unit: 22.2 molar%).

The physical properties of the resulting polyimidesiloxane are set forth in Table 5.

REFERENCE EXAMPLE 22

Preparation of Polyimidesiloxane

In a 500 ml-volume glass flask, 0.048 mol of 2,3,3',4'-biphenyltetracarboxylic dianhydride (a-BPDA), 0.016 mol of the diaminopolysiloxane (X-22-161AS), 0.032 mol of 2,2-bis(4-(4-aminophenoxy)phenyl)propane (BAPP) and 165 g of N-methyl-2-pyrrolidone (NMP) were stirred at 50° C. for 2 hrs. in a nitrogen stream to give an amic acid oligomer. The reaction solution was then heated to approx. 200° C. and stirred at the temperature for 3 hrs. to produce a polyimidesiloxane (random polymer, logarithmic viscosity: 0.56, content of siloxane unit: 33.3 molar%).

The physical properties of the resulting polyimidesiloxane are set forth in Table 5.

TABLE 5

| Ref. Ex. | Imidesiloxane Oligomer (mol) | Imide Oligomer (mol) | Polyimidesiloxane solution Log. Viscosity | Siloxane Unit Content (mol %) | Film (25 μm) Elasticity Modulus Softening Temp. |
|---|---|---|---|---|---|
| 16 | A-2 (0.0055) | B-3 (0.0055) | 0.49 | 22.22 | 125 kg/mm$^2$ 235° C. |
| 17 | A-3 (0.0025) | B-4 (0.0025) | 0.45 | 33.33 | 35 kg/mm$^2$ 160° C. |
| 18 | A-1 (0.015) | B-1 (0.015) | 0.46 | 33.33 | 70 kg/mm$^2$ 170° C. |
| 19 | A-2 (0.01) | B-3 (0.01) | 0.48 | 40.00 | 60 kg/mm$^2$ 185° C. |
| 20 | A-3 (0.0033) | B-3 (0.0033) | 0.55 | 46.20 | 20 kg/mm$^2$ 110° C. |
| 21 | One-step Copolymerization | | 0.59 | 22.22 | 130 kg/mm$^2$ 205° C. |
| 22 | One-step Copolymerization | | 0.56 | 33.33 | 75 kg/mm$^2$ 200° C. |

EXAMPLE 13

Preparation of Adhesive Composition Solution

In a 500 ml-volume glass flask, 25 g of the polyimidesiloxane (block polymer A-2-B-3 prepared in Reference Example 16), 45 g of a bismaleimide resin (Conpimide 353, produced by Technochemie Corp.), 30 g of an epoxy resin (Epikote 152, produced by Yuka Shell Epoxy Co., Ltd.), 2.5 g of 2-phenylimidazole (hardener) and 185 g of dioxane were stirred at room temperature (25° C.) for about 2 hrs., to give a homogeneous adhesive composition solution having a viscosity at 25° C. of 7 poise. This solution kept its homogeneous state, even after standing it to allow at room temperature for 1 week.

Production of Composite Sheet using Adhesive Composition Solution

The above-obtained adhesive composition solution was cast on a polyimide film (UPILEX S-type, available from Ube Industries, Ltd.: thickness: 75 μm) to give a cast layer of 125 μm thick using a doctor blade. The cast layer was dried at 50° C. for 30 min., and at 100° C. for 30 min., to give a uncured dry adhesive layer of approx. 20 um thick (softening temperature: 60° C.).

The polyimide film having the uncured dry adhesive layer was placed on a copper foil (thickness: 35 μm) and passed between a pair of laminating rolls heated to 130° C. under pressure to firmly fix the polyimide film onto the copper foil. The fixed film and foil were together heated in a nitrogen stream to 100° C. for 1 hr., to 120° C. for 1 hr., to 180° C. for 1 hr., to 200° C. for 1 hr., and finally to 220° C. for 5 hrs., to completely cure the adhesive layer.

The produced composite material was measured in its adhesive strength. The result is set forth in Table 6.

EXAMPLES 14 TO 21

Preparation of Adhesive Composition Solution

The procedures of Example 13 were repeated except that the polyimidesiloxane (block polymer), the bismaleimide resin, and the epoxy compound were replaced with those set forth in Table 6, to give an adhesive composition solution having a viscosity set forth in Table 6. The amount of the solvent (i.e., dioxane) was changed to 230 g in Examples 16–20, and to 200 g in Example 21. Further, the amount of hardner was changed to 1.0 g.

Production of Composite Sheet using Adhesive Composition Solution

The procedures of Example 13 were repeated except for using the adhesive composition solution set forth in Table 6. The produced composite material was measured in its adhesive strength. The results are set forth in Table 6.

EXAMPLES 22 AND 23

Preparation of Adhesive Composition Solution

The procedures of Example 13 were repeated except that the polyimidesiloxane (random polymer), the bismaleimide resin, and the epoxy compound set forth in Table 6 were used, to give an adhesive composition solution having a viscosity set forth in Table 6. The amount of the solvent (i.e., dioxane) was changed to 230 g.

Production of Composite Sheet using Adhesive Composition Solution

The procedures of Example 13 were repeated except for using the adhesive composition solution set forth in Table 6. The produced composite material was measured in its adhesive strength. The results are set forth in Table 6. The amount of hardner was changed to 1.0 g.

TABLE 6

| Ex. | Polyimide-siloxane Block (Ref. No.) Amount | Bismale-imide resin Name used | Epoxy Compound Name | Adhesive Layer Softening Temp. (°C.) | Composite Adhesive 25° C./ 180° C. |
| --- | --- | --- | --- | --- | --- |
| 13 | A-2/B-3 (No. 16) 25 g | Compimide 353 30 g | Epikote 152 30 g | 60 | 1.3/0.9 (kg/cm) |
| 14 | A-2/B-3 (No. 16) 24 g | Kelimide 43 g | Epikote 152 Tetrade X 24 g/9 g | 75 | 1.4/0.9 (kg/cm) |
| 15 | A-2/B-3 (No. 16) 24 g | ATU-BMI 43 g | Epikote 828 33 g | 55 | 1.5/0.7 (kg/cm) |
| 16 | A-2/B-3 (No. 16) 33 g | Bismale-imide* 43 g | Epikote 152 Tetrade X 21 g/8 g | 80 | 1.5/1.0 (kg/cm) |
| 17 | A-3/B-4 (No. 17) 33 g | ATU-BMI 38 g | Epikote 871 Tetrade X 21 g/8 g | 65 | 1.3/0.6 (kg/cm) |
| 18 | A-1/B-1 (No. 18) 33 g | ATU-BMI 38 g | Epikote 871 Tetrade X 21 g/8 g | 60 | 1.5/0.5 (kg/cm) |
| 19 | A-2/B-2 (No. 19) 33 g | ATU-BMI 38 g | Epikote 152 Tetrade X 21 g/8 g | 60 | 1.4/0.5 (kg/cm) |
| 20 | A-3/B-3 (No. 20) 33 g | ATU-BMI 38 g | Epikote 152 Tetrade X 21 g/8 g | 55 | 1.2/0.5 (kg/cm) |
| 21 | A-2/B-2 (No. 19) 55 g | Kelimide 5 g | Epikote 152 Epikote 871 20 g/10 g | 65 | 1.5/0.6 (kg/cm) |

TABLE 6-continued

| Ex. | Polyimide-siloxane Block (Ref. No.) Amount used | Bismale-imide resin Name | Epoxy Compound Name | Adhesive Layer Softening Temp. (°C.) | Composite Adhesive 25° C./ 180° C. |
|---|---|---|---|---|---|
| 22 | Random (No. 21) 33 g | ATU-BMI 38 g | Epikote 152 Tetrade X 21 g/8 g | 70 | 1.8/0.9 (kg/cm) |
| 23 | Random (No. 22) 33 g | ATU-BMI 38 g | Epikote 152 Tetrade X 21 g/8 g | 55 | 1.5/0.6 (kg/cm) |

Remarks:
Conpimide 353: available from Technochemie Corp.
Kelimide: available from Nippon Polyimide Co., Ltd.
ATU-BMI: available from Ajinomoto Co., Ltd.
Bismaleimide*: available from Mitsui Toatsu Co., Ltd.

REFERENCE EXAMPLE 23

Preparation of Bismaleimide Resin A

In a 500 ml-volume glass flask, 0.1309 mol of bis(4-(3-aminophenoxy)phenyl)sulfone (3-BAPS), 0.27 mol of maleic anhydride, and 280 g of N,N-dimethylacetamide (DMAC) were stirred at approx. 170° C. for approx. 3 hrs. in a nitrogen stream, to give bismaleimide resin A having the following formula (III):

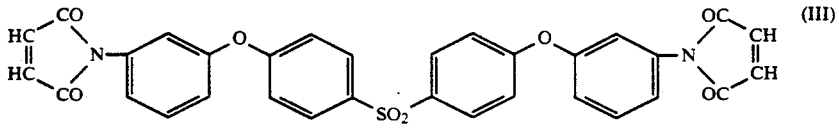

REFERENCE EXAMPLE 25

Preparation of Bismaleimide Resin B

In a 500 ml-volume glass flask, 0.1 mmol of a-BPDA, 0.2 mmol of 1,3-bis(4-aminophenoxy)benzene (TPE-R), and 240 g of N,N-dimethylacetamide (DMAC) were stirred at approx. 170° C. for approx. 3 hrs. in a nitrogen stream, to give bismaleimide resin B having the aforementioned formula (II) wherein A and R in the formula means the following moiety:

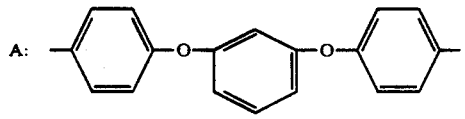

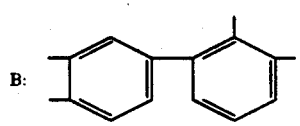

EXAMPLE 24

Preparation of Adhesive Composition Solution

In a 500 ml-volume glass flask, 55 g of the polyimidesiloxane (block polymer A-2-B-3, prepared in Reference Example 16), 45 g of Bismaleide resin A (prepared in Reference Example 23), 40 g of an epoxy resin (mixture of Epikote 152, Epikote 871, and Tetrade X), 2.0 g of 2-phenylimidazole (hardener) and 200 g of dioxane were stirred at room temperature (25° C.) for approx. 2 hrs., to give a homogeneous adhesive composition solution having a viscosity at 25° C. of 12 poise.

This solution kept its homogeneous state, even after standing it to allow at room temperature for 1 week.

Production of Composite Sheet using Adhesive Composition Solution

The procedures of Example 13 were repeated except for using the adhesive composition solution set forth in Table 7, to give a composite material having the properties shown in Table 7.

EXAMPLES 25 TO 34

Preparation of Adhesive Composition Solution

The procedures of Example 24 were repeated except that the polyimidesiloxane (block polymer) and the bismaleimide resin set forth in Table 7 were employed to give a homogeneous adhesive composition solution. In the procedure, the hardner was changed to 25 g of 4,4'-diaminodiphenylmethane (Example 27), to 26 g of 4,4'-diaminodiphenylsulfone (Examples 28 & 34), to 20 g of novolak (Example 33). In Example 32, 25 g of 4,4'-diaminodiphenylmethane was added.

Production of Composite Sheet using Adhesive Composition Solution

The procedures of Example 13 were repeated except for using the adhesive composition solution set forth in Table 7, to give a composite material having the properties shown in Table 7.

TABLE 7

| Ex. | Polyimide-siloxane (Block) (Ref.) Amount used | Epoxy Compound Name | Maleimide Resin Name | Laminated Composite Adhesive Strength 25° C./ 180° C. | Etched Film Thick- Curv.- Radius |
|---|---|---|---|---|---|
| 24 | A-2/B-3 (No. 16) 55 g | Epikote 152 Epikote 871 Tetrade X 40 g | Bismale-imide Resin A 5 g | 2.20/0.90 (kg/cm) | 21 μm 110 mm |
| 25 | A-3/B-4 (No. 17) 55 g | Epikote 152 Epikote 871 Tetrade X 40 g | Bismale-imide Resin A 5 g | 1.80/0.60 (kg/cm) | 21 μm 300 mm |
| 26 | A-1/B-1 (No. 18) | Epikote 152 Epikote 871 Tetrade X | Bismale-imide Resin A | 2.20/0.90 (kg/cm) | 21 μm 130 mm |

TABLE 7-continued

| Ex. | Polyimide-siloxane (Block) (Ref.) | Epoxy Compound Name Amount used | Maleimide Resin Name | Laminated Composite Adhesive Strength 25° C./ 180° C. | Etched Film Thick- Curv.- Radius |
|---|---|---|---|---|---|
| 27 | A-2/B-2 (No. 19) 55 g | Epikote 152 Epikote 871 Tetrade X 40 g | Bismale- imide Resin A 5 g | 2.00/0.60 (kg/cm) | 20 μm 150 mm |
| 28 | A-3/B-3 (No. 20) 55 g | Epikote 152 Epikote 871 Tetrade X 40 g | Bismale- imide Resin A 5 g | 1.70/0.60 (kg/cm) | 20 μm 400 mm |
| 29 | One-step (No. 21) 55 g | Epikote 152 Epikote 871 Tetrade X 40 g | Bismale- imide Resin A 5 g | 2.00/0.85 (kg/cm) | 21 μm 100 mm |
| 30 | One-step (No. 22) 55 g | Epikote 152 Epikote 871 Tetrade X 40 g | Bismale- imide Resin A 5 g | 1.80/0.70 (kg/cm) | 21 um 110 mm |
| 31 | A-2/B-2 (No. 19) 55 g | Epikote 152 Epikote 871 Tetrade X 40 g | Kelimide NE20200 5 g | 1.25/0.50 (kg/cm) | 21 μm 110 mm |
| 32 | A-3/B-3 (No. 20) 50 g | Epikote 152 Tetrade X IPU-22G 40 g | Bismale- imide Resin B 10 g | 1.50/0.50 (kg/cm) | 20 μm 250 mm |
| 33 | A-3/B-3 (No. 20) 50 g | Epikote 152 Tetrade X IPU-22G 40 g | Bismale- imide* 10 g | 1.80/0.60 (kg/cm) | 21 μm 105 mm |
| 34 | One-step (No. 21) 50 g | Epikote 152 Epikote 871 IPU-22G 40 g | Bismale- imide* 10 g | 1.40/0.80 (kg/cm) | 18 μm 85 mm |

We claim:

1. A heat resistant adhesive composition comprising 100 weight parts of a polyimidesiloxane obtained from a biphenyltetracarboxylic acid selected from the group consisting of 2,3,3',4'-biphenyltetracarboxylic acid, 3,3'4,4'-biphenyltetracarboxylic acid, dianhydrides of said acids and esters of said acids, and a diamine composition comprising a diaminopolysiloxane having the formula (I):

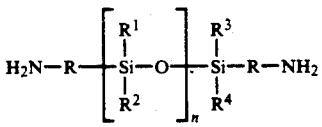

(I)

wherein R is a divalent hydrocarbon group, each of $R^1$, $R^2$, $R^3$ and $R^4$ independently is a lower alkyl group or phenyl group, and n is an integer of 3–60, and an aromatic diamine, said diaminopolysiloxane and aromatic diamine being used in a ratio of 2:8 to 8:2;

10–500 weight parts of an epoxy resin having an epoxy group; and an epoxy resin-hardening agent in an amount of 0.01–60 weight parts per 100 weight parts of the epoxy compound.

2. A heat resistant adhesive composition film having a thickness of 1 to 200 μm, wherein said adhesive composition comprises:

100 weight parts of a polyimidesiloxane obtained from a biphenyltetracarboxylic acid selected from the group consisting of 2,3,3',4'-biphenyltetracarboxylic acid, 3,3',4,4'-biphenyltetracarboxylic acid, dianhydrides of said acids and esters of said acids, and a diamine composition comprising a diaminopolysiloxane having the formula (I):

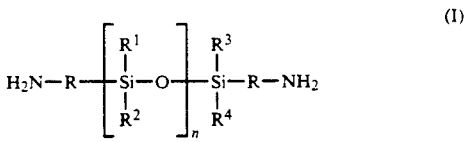

(I)

wherein R is a divalent hydrocarbon group, each of $R^1$, $R^2$, $R^3$ and $R^4$ independently is a lower alkyl group or phenyl group, and n is an integer of 3–60, and an aromatic diamine, said diaminopolysiloxane and aromatic diamine being used in a ratio of 2:8 to 8:2;

10–500 weight parts of an epoxy resin having an epoxy group; and an epoxy resin-hardening agent in an amount of 0.01–60 weight parts per 100 weight parts of the epoxy compound.

3. A composite sheet comprising a metal film and an aromatic polyimide film adhered to each other by a heat resistant resinous composition film, wherein said resinous composition film comprises:

100 weight parts of a polyimidesiloxane obtained from a biphenyltetracarboxylic acid selected from the group consisting of 2,3,3',4'-biphenyltetracarboxylic acid, 3,3',4,4'-biphenyltetracarboxylic acid, dianhydrides of said acids and esters of said acids, and a diamine composition comprising a diaminopolysiloxane having the formula (I):

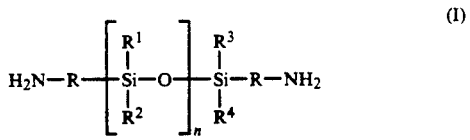

(I)

wherein R is a divalent hydrocarbon group, each of $R^1$, $R^2$, $R^3$ and $R^4$ independently is a lower alkyl group or phenyl group, and n is an integer of 3–60, and an aromatic diamine, said diaminopolysiloxane and aromatic diamine being used in a ratio of 2:8 to 8:2;

10–500 weight parts of an epoxy resin having an epoxy group; and an epoxy resin-hardening agent in an amount of 0.01–60 weight parts per 100 weight parts of the epoxy compound.

4. The heat resistant adhesive composition as defined in claim 1, wherein said composition further contains 5–500 weight parts of a bismaleimide resin.

5. The heat resistant adhesive composition as defined in claim 1, wherein said composition comprises 100 weight parts of the polyimidesiloxane, 55–250 weight parts of the epoxy resin, 5–500 weight parts of a bismaleimide resin, and the epoxy resin-hardening agent in an amount of 0.01–60 weight parts per 100 weight parts of the epoxy resin.

6. The heat resistant adhesive composition film as defined in claim 2, wherein said composition comprises 100 weight parts of the polyimidesiloxane, 55–250 weight parts of the epoxy resin, 5–500 weight parts of a bismaleimide resin, and the epoxy resin-hardening agent in an amount of 0.01–60 weight parts per 100 weight parts of the epoxy resin.

7. The composite sheet as defined in claim 3, wherein said composition comprises 100 weight parts of the polyimidesiloxane, 55–250 weight parts of the epoxy resin, 5–500 weight parts of a bismaleimide resin, and the epoxy resin-hardening agent in an amount of 0.01–60 weight parts per 100 weight parts of the epoxy resin.

* * * * *